US009281789B2

United States Patent
Snoeij et al.

(10) Patent No.: US 9,281,789 B2
(45) Date of Patent: Mar. 8, 2016

(54) INTEGRATED CIRCUIT FOR USE IN A HYBRID OUTPUT STAGE

(71) Applicant: Texas Instruments Deutschland GmbH, Freising (DE)

(72) Inventors: Martijn F. Snoeij, Erding (DE); Mikhail V. Ivanov, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 14/058,026

(22) Filed: Oct. 18, 2013

(65) Prior Publication Data

US 2014/0184340 A1 Jul. 3, 2014

Related U.S. Application Data

(60) Provisional application No. 61/747,890, filed on Dec. 31, 2012.

(51) Int. Cl.
*H03F 3/26* (2006.01)
*H03F 3/30* (2006.01)

(52) U.S. Cl.
CPC ............ *H03F 3/3066* (2013.01); *H03F 3/3028* (2013.01); *H03F 2200/411* (2013.01); *H03F 2203/30021* (2013.01); *H03F 2203/30078* (2013.01); *H03F 2203/30081* (2013.01); *H03F 2203/30111* (2013.01); *H03F 2203/30114* (2013.01)

(58) Field of Classification Search
CPC ............ H03F 3/26; H03F 3/30; H03F 3/3008
USPC .................. 330/264, 267, 265, 300
See application file for complete search history.

(56) References Cited

U.S. PATENT DOCUMENTS 4,959,623 A * 9/1990 Khoury .......................... 330/265
5,162,753 A * 11/1992 Khorramabadi ............... 330/264
6,788,147 B1 * 9/2004 Lubbers ........................ 330/264

OTHER PUBLICATIONS

Walker, P.J., "Current dumping audio amplifier", Wireless World, 1975, 81, pp. 560-562.
Monticelli, D., "A Quad CMOS Single-Supply Op Amp with Rail-to-Rail Output Swing", ISSC vol. SC-21, No. 6, Dec. 1986, pp. 1026-1034.
Huijsing, J.H., "Operational Amplifiers: Theory and Design", Kluwer Academic Publishers, 2001, Fig. 5.3.21 on p. 159.

* cited by examiner

*Primary Examiner* — Steven J Mottola
(74) *Attorney, Agent, or Firm* — Andy Viger; Frank D. Cimino

(57) ABSTRACT

This invention generally relates to the technical field of integrated circuits. More specifically the invention relates to output stages for providing an output signal, into which an integrated circuit may be used. An aspect relates to an integrated circuit capable of driving an external class-B output stage in a manner that allows providing a continuous output signal over the full range of desired outputs. The integrated circuit may comprise a class-AB output stage working in conjunction with the class-B output stage so as to provide a hybrid output stage. The integrated circuit may prevent dead band problems commonly faced when employing a class-B output stage. The integrated circuit may also reduce the quiescent current of the hybrid output stage. This may have further advantages, such as for example, the output stage producing less heat/power than needs to be dissipated.

12 Claims, 7 Drawing Sheets

CLASS-AB OUTPUT STAGE
12 $I_{OUT} = I_{PMOS} - I_{NMOS}$

CLASS-B OUTPUT STAGE 13

HYBRID OUTPUT STAGE

INTEGRATED CIRCUIT FOR USE IN A HYBRID OUTPUT STAGE

PRIORITY

This Application claims priority to U.S. Provisional Application No. 61/747,890, filed Dec. 31, 2012, entitled "Integrated Circuit For Use In A Hybrid output Stage", which is incorporated by reference in its entirety.

TECHNICAL FIELD

This invention generally relates to the technical field of integrated circuits. More specifically the invention relates to output stages for providing an output signal, into which an integrated circuit may be used and also to related methods.

BACKGROUND

Conventionally, class-A amplifiers (class-A output stages) are known to always carry significant current level to the output device(s). Thus they typically have a large quiescent current, and are often inefficient in terms of power. The quiescent current may be defined as the current level in the amplifier when it is producing an output of zero. Class-A amplifiers typically vary a large quiescent current in order to generate a varying current in the load. More efficient class-A amplifiers make use of what is commonly known as a double ended or push-pull arrangement, where a pair of transistors is connecting to the two rails. One of them is an NPN bipolar transistor, the other is a PNP bipolar transistor. Ideally, these two transistors have equivalent properties except for the difference in the signs of their voltages and currents. However, even in a push-pull arrangement power losses due to the quiescent current are an issue.

Class-B amplifiers are also often used in a push-pull arrangement connected to the two rails, while only one of the two bipolar transistors is conducting at a given time instance. Because one of the bipolar transistors is switched on and the other one is switched off the dissipation of power is lower. In quiescent condition, both bipolar transistors are turned off so that no quiescent current is flowing. However, push-pull type class-B amplifiers tend to have difficulty whenever the changing polarity, where one transistor is to be switched off and the other one is to be turned on. The result is what is called crossover distortion, which is often is enhanced due to non-linearity in the transistors. An exemplary discussion of class-B amplifiers can be found for example in P. J. Walker, "Current dumping audio amplifier", Wireless World, 1975, 81, pp. 560-562. Class-AB amplifiers typically use a push-pull arrangement and may be considered a hybrid of the class-A amplifiers and Class-B amplifiers in that they operate similar to Class-B amplifiers, but in contrast to them both transistors conduct current at the same time. Hence, even when the output current is to be majorly provided from one of the two transistors, the other one is still conducting a small current. This allows significantly reducing or even eliminating crossover distortion, but the exact choice of quiescent current has major impact on the level of distortion generated in the class-AB amplifier. Often, the bias voltage applied to the base of the bipolar transistors to set this quiescent current has to be adjusted with the temperature of the output transistors, which typically requires the class-AB control circuitry more complex, e.g. due to requiring an exact copy of the voltages at the bipolar transistors for setting the quiescent current. An example of a class-AB control circuit is for example known from D. Monticelli, "A Quad CMOS Single-Supply Opamp with Rail-to-Rail Output Swing", ISSCC Dig. Tech. Papers, pp. 18-19, February 1986.

In high-voltage applications, where the rail voltages are several tens of volts and the currents to be delivered by the output stage may be several hundreds of milliamps (mA) or more, such amplifier stages may be very difficult to realize on-chip, i.e. on an integrated circuit. For example, conventional class-AB amplifiers require a large die area since transistors capable of handling high voltage and currents are large. Moreover, the on-chip power dissipation necessitates a good heat sink, which is typically large in size and costly.

Sometimes, on-chip class-D amplifiers using MOS transistors and providing an output signal based on pulse-width-modulated signals (PWM) are therefore used in high-voltage, high-current applications. However, due to switching (PWM), class-D amplifiers may cause interference with other analogue circuitry present in the system, which may be undesirable. Another solution for providing a high-voltage, high-current amplifier may be a fully discrete solution on a circuit board, but this would require a large board area and component count.

SUMMARY

An aspect of the invention relates to an integrated circuit that is capable of driving an external class-B output stage in a manner that allows providing a continuous output signal over the full range of desired outputs. The integrated circuit may comprise a class-AB output stage working in conjunction with the class-B output stage so as to provide a hybrid output stage. The integrated circuit may prevent dead band problems commonly faced when employing a class-B output stage. The integrated circuit may also reduce the quiescent current of the hybrid output stage. This may have further advantages, such as for example, the output stage producing less heat/power than needs to be dissipated.

In one further aspect, the class-AB output stage of the integrated circuit and the class-B output stage of the integrated circuit have a common output terminal. The integrated circuit controls the control signal to the external class-B output stage and the output signal provided by the integrated circuit to the common output terminal so that they have a substantially fixed ratio to each other.

One exemplary embodiment provides an integrated circuit comprising a class-AB output stage for outputting an output signal to an output terminal of the integrated circuit. The class-AB output stage and an external class-B output stage are to form a hybrid output stage that is to provide an output signal on a common output terminal. The integrated circuit may also comprise a driver stage for controlling the class-AB output stage and the external class-B output stage in response to at least one setting signal setting the desired output signal to be output at the common output terminal of the hybrid output stage.

In another exemplary embodiment, the output terminals of the class-AB output stage and the external class-B output stage may be connected to the common output terminal of the hybrid output stage.

In a further embodiment, the driver stage is adapted to control the external class-B output stage directly by at least one control signal. Alternatively, the driver stage may also control the external class-B output stage via the class-AB output stage using at least one control signal. The control signal may be output by the integrated circuit to the external class-B output stage.

In another embodiment, the hybrid output stage may be operated rail-to-rail, and may thus also be referred to as a rail-to-rail hybrid output stage.

In some embodiments, the external class-B output stage that is to be driven by the integrated circuit may include one or more bipolar transistors. At least some of the bipolar transistors or all of them may be driven by one or more control signals output by the integrated circuit to the external class-B output stage.

In one more specific, exemplary embodiment, the class-AB output stage of the integrated circuit may comprise at least one pair of transistors. In some implementations, there may be more than one pair of transistors. A pair of transistors may have a common gate. The common gate may be driven by the driver stage using a common control signal so that the currents flowing through the two transistors have a substantially fixed ratio. One of the transistors of the pair may control the output signal of the class-AB output stage applied to the output terminal of the integrated circuit. The other one of the transistors may controls the base current of a respective bipolar transistor of the class-B output stage so as to control its output signal applied to the common output terminal. In a more detailed exemplary implementation of the embodiment, the sources of the transistors of the pair could be for example connected to each other via a node so as to have an equal potential. Optionally, this node may be connected to a first rail voltage potential via a resistor. Further optionally, the node may be connected to the base of the respective bipolar transistor of the class-B output stage. This connection may be via a resistor.

In a further more detailed exemplary implementation of the embodiment, the drain of the transistor that is to control the output signal of the class-AB output stage may be connected to the output terminal of the integrated circuit via a diode. Similarly, the drain of the transistor that is to control the base current of the respective bipolar transistor of the class-B output stage may be connected to a second rail voltage potential, different from a first rail potential.

In another more specific, exemplary embodiment, the integrated circuit further comprises a class-B drive circuit. The class-B drive circuit may have at least one transistor. Furthermore, the class-AB output stage of the integrated circuit may (also) comprise at least one transistor.

In one exemplary implementation of the embodiment, a transistor of the class-B drive circuit and a transistor of the class-AB output stage form a pair of transistors. A pair of transistors may have a common gate. The common gate may be driven by the driver stage using a common control signal. The common control signal may cause the currents flowing through the two transistors to have a substantially fixed ratio.

The class-AB output stage's transistor of each pair may for example be used to control the output signal of the class-AB output stage to the output terminal of the integrated circuit. Moreover, the class-B drive circuit's transistor of each pair may be used to control the base current of a respective bipolar transistor of the class-B output stage so as to control its output signal applied to the common output terminal.

In a further exemplary implementation of the embodiment, the source of the transistors of each pair may be connected to a first rail voltage potential via a respective resistor. The resistances of the two resistors of each transistor pair may have a fixed ratio. The fixed ratio may be for example chosen so that the potential at the sources of the transistors of each pair are equal to each other. In an exemplary implementation, the source of the class-B drive circuit's transistor of a pair may be connected to the base of the respective bipolar transistor of the class-B output stage. This connection may be via a resistor.

In a further exemplary implementation of the embodiment, the drain of each of the class-AB output stage's transistors may be connected to the output terminal of the integrated circuit via a respective diode.

In an exemplary embodiment, the there are two pairs of transistors allowing for a rail-to-rail operation of the hybrid output stage.

In a further embodiment, at least one setting signal may comprise a first setting signal providing a reference voltage equivalent to the desired output signal. The at least one setting signal may also comprise a second setting signal providing a feedback voltage equivalent to the instantaneous output signal delivered by the hybrid output stage. Another exemplary embodiment relates to a method for operating an hybrid output stage formed by an on-chip class-AB output stage interworking with an off-chip class-B output stage to provide a common output signal. In this method class-AB control of the on-chip class-AB output stage is performed, in response to at least one setting signal, to provide a first output signal. Further, class-B control of the class-B output stage is performed, also in response to said at least one setting signal, to provide a second output signal. The method further comprises providing the common output signal of the hybrid output stage by adding the first output signal and the second output signal. The common output signal corresponds to the first output signal in a dead band region of the class-B output stage, in which the second output signal of the class-B output stage is substantially zero.

In a more detailed exemplary embodiment, the method further comprises providing one or more transistor pairs, wherein one of the transistors of each pair contributes to the first output signal of the class-AB output stage, while the other transistor of each pair is connected to the base of a respective bipolar transistor of the class-B output stage to a respective rail voltage. The current ratio between the currents flowing through the first and second transistors of each pair is controlled to have a substantially fixed ratio.

Performing class-AB control may for example comprise controlling the two transistors of the on-chip class-AB output stage such that each transistor is always in a conducting state. Performing class-B control may for example comprise controlling the two transistors of the off-chip class-B output stage such that only one transistor is in a conducting stage at a time.

BRIEF DESCRIPTION OF THE DRAWINGS

Reference is now made to the following descriptions.

DETAILED DESCRIPTION

This invention generally relates to the technical field of integrated circuits (ICs). More specifically the invention relates to output stages for providing an output signal, into which an integrated circuit may be used. In this description, the terms "source", "drain" and "gate" as well as "emitter", "collector" and "base" are interchangeably used. Commonly "source", "drain" and "gate" are used to denote the terminals of MOS transistors, while "emitter", "collector" and "base" are commonly used to denote the equivalent terminals of a bipolar transistor. However, it should be noted that the use of these terms herein is not intended to limit the claims to a specific type of technology of the transistors, unless this is specifically mentioned. Rather the terms should be understood distinguishing the terminals of the transistor and their respective functions.

Figure 1:
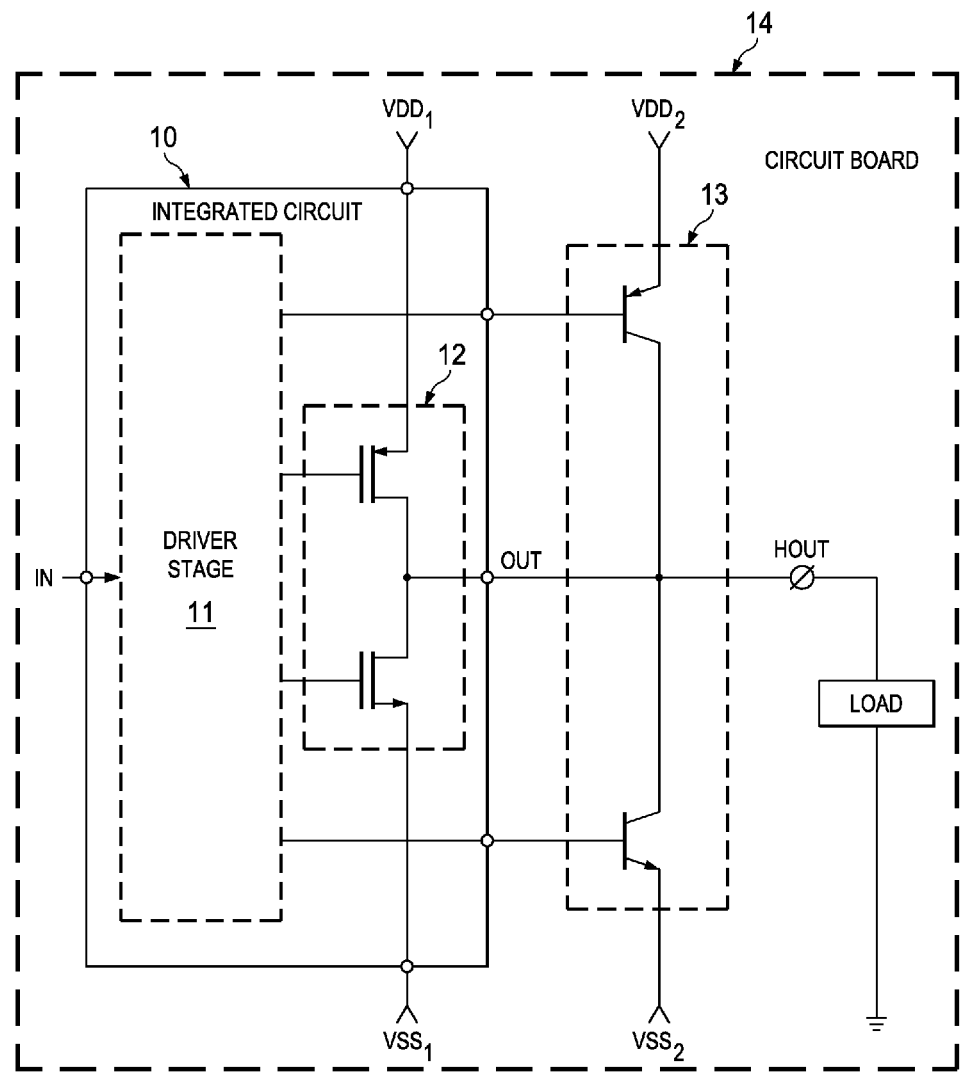
FIG. 1 shows a conceptual overview of an integrated circuit according to an embodiment of the invention, when operated in conjunction with an external output stage so as to provide a hybrid output stage.

An aspect of the invention relates to an integrated circuit 10 as exemplarily shown in FIG. 1. The integrated circuit 10 may comprise a driver stage 11 and a class-AB output stage 12. The class-AB output stage 12 may be operated in conjunction with the external class-B output stage 13 so as to provide a hybrid output stage. The term hybrid is used to reflect this interoperation of the two output stages. The class-AB output stage 12 may be a class-AB amplifier stage. The class-B output stage 13 may be a class-B amplifier stage.

The driver stage 11 may be capable of driving an external class-B output stage 13. It should be noted that external means that the class-B output state is not provided in the integrated circuit 10, but externally for example on a circuit board 14. The integrated circuit 10 may suitably designed for mounting on the circuit board 14, so that it can provide a hybrid output stage in cooperation with the class-B output stage 13 on the printed circuit board 14. Therefore, another aspect is related to a hybrid output stage formed by an integrated circuit 10 that is mounted on a circuit board 14, e.g. a printed circuit board 14 (PCB), and operating in conjunction with a class-B output stage 13 provided on the circuit board 14.

One potential advantage that may be realized by using the integrated circuit 10 is preventing dead band problems commonly faced when employing a class-B output stage 13. Another potential advantage that may be obtained by the use of the integrated circuit 10 in a hybrid output stage is a reduction of the quiescent current of the hybrid output stage, in comparison to a state-of-the art class-AB output stage 13. This may have further advantages, such as for example, the output stage producing less heat/power than needs to be dissipated.

Moreover, considering for example a class-D amplifier stage, which is also referred to as a switching amplifier, same typically uses pulse-width-modulation (PWM) to control the output voltage. Class-D amplifiers often require external inductors, which are costly. They also may interfere with other circuitry in the systems where they are used. The hybrid output stage discussed herein stage discussed herein may avoid these potential problems, by using a class-AB amplifier stage working in conjunction with a class-B amplifier stage.

In one exemplary implementation, the class-AB output stage 12 of the integrated circuit 10 and the class-B output stage 13 the integrated circuit 10 have a common output terminal HOUT. The integrated circuit 10 controls the control signal to the external class-B output stage 13 and the output signal provided by the integrated circuit 10 to the common output terminal HOUT so that the current that flows through the load is suitably divided between the internal stage 12 and external stage 13. The output signal may be an output current or an output voltage. It is apparent that the two are linked, i.e. depend on the load connected to the common output terminal HOUT. One can assume without loss of generality, that a given output current of an amplifier stage has a corresponding compliance voltage range that can be provided by the amplifier stage. Likewise, a given output voltage of an amplifier stage has a corresponding compliance current range that can be provided by the amplifier stage.

One exemplary embodiment provides an integrated circuit 10 comprising a class-AB output stage 12 and driver stage 11. The class-AB output stage 12 outputs an output signal to an output terminal of the integrated circuit 10. The class-AB output stage 12 and an external class-B output stage 13 form a hybrid output stage that provides an output signal on a common output terminal HOUT. The output signal on a common output terminal HOUT may correspond to the sum of outputs signals provided by the class-AB output stage 12 and the external class-B output stage 13.

For example, in case the output signal at the common output terminal HOUT of the hybrid output stage is a current, it can be considered the sum of the output currents provided by the class-AB output stage 12 and the external class-B output stage 13. In this context, it should be noted that providing a current actually refers to the respective output stage acting as a current source or current sink, depending on the potential at the common output terminal HOUT.

The driver stage 11 controls the class-AB output stage 12 and the external class-B output stage 13 in response to at least one setting signal setting the desired output signal to be output at the common output terminal HOUT of the hybrid output stage. As will become more apparent from the following, the driver stage 11 may control the external class-B output stage 13 via the class-AB output stage 12. This may be the case, where the control signal(s) applied to the external class-B output stage 13 are derived from the circuitry forming the class-AB output stage 12. Alternatively, there may be a dedicated class-B control circuit provided on the integrated circuit 10, which is driven by the driver stage 11 to solely control the external class-B output stage 13. In both alternatives, the drive circuit may apply control such that the external class-B output stage 13 and the class-AB output stage 12 mate with each other and provide an output signal with no dead bands.

The at least one setting signal may for example comprise a first setting signal providing a reference voltage equivalent to the desired output signal. The at least one setting signal may also comprise a second setting signal providing a feedback voltage equivalent to the instantaneous output signal delivered by the hybrid output stage.

In some embodiments, the control by the driver stage 11 may include directly controlling the external class-B output stage 13 by at least one control signal. In other embodiments, the driver stage 11 may control the external class-B output stage 13 via the class-AB output stage 12 using at least one control signal. In both cases, the control signal may be output by the integrated circuit 10 to the external class-B output stage 13. In another embodiment, the hybrid output stage provided by means of the external class-B output stage 13 and the integrated circuit 10's class-AB output stage 12 is a rail-to-rail hybrid output stage.

The external class-B output stage 13 that is to be driven by the integrated circuit 10 may be using bipolar transistors, and may thus include one or more bipolar transistors. At least some of the bipolar transistors or all of them may be driven by one or more control signals output by the integrated circuit 10 to the external class-B output stage 13.

As will be explained in more detail below, the class-AB output stage 12 may be considered to be (virtually) separated in high side stage and a low side stage. Furthermore, the class-AB output stage 12 of the integrated circuit 10 may comprise two pairs of transistors. One pair of transistors may be part of the high side stage of the class-AB output stage 12, while the other pair is part of the low side stage of the class-AB output stage 12. The transistors of the transistor pair in the high side stage may be PMOS-transistors, while the transistors of the transistor pair in the low side stage may be NMOS-transistors. In general, the transistors on the integrated circuit 10 may be MOS transistors, bipolar transistors, or the like.

Each of the two pairs of transistors may have a common gate. The common gate of each transistor pair may be driven by the driver stage 11 using a common control signal. The transistors may be controlled by the drive stage 11 in an analogue fashion, in contrast to digitally switched control. The driver stage 11 may thus for example provide non-discrete currents as control signals to control the transistors. The common control signals may ensure that the currents flowing through the two transistors of the respective pair are matched, i.e. have a substantially fixed ratio. In both, the high side stage and the low side stage, one of the transistors of the pair may control the output signal of the class-AB output stage 12 applied to the output terminal OUT of the integrated circuit 10. The other one of the transistors may control the base current of a respective bipolar transistor of the class-B output stage 13 so as to control its output signal applied to the common output terminal HOUT.

In a more detailed exemplary implementation of the embodiment, the sources of the transistors of each pair could be for example connected to each other via a respective node so as to have an equal potential. The node of the high side stage may be connected to a first rail voltage potential via a first resistor. Further, the node of the high side stage may be connected to the base of a first bipolar transistor of the class-B output stage 13. This connection may be via a second resistor. Also the node of the low side stage may be connected to a second rail voltage potential, different from the first rail voltage potential, via a third resistor. Further, the node of the low side stage may be connected to the base of a second bipolar transistor of the class-B output stage 13. This connection may be via a fourth resistor.

In a more detailed exemplary implementation, the drains of the two transistors of the two transistor pairs provided in the high side and low side stage that are to control the output signal of the class-AB output stage 12 may be connected to the output terminal OUT of the integrated circuit 10 via a diode, respectively. The output terminal OUT is connected to the common output terminal HOUT of the hybrid output stage.

Similarly, the sources of the two transistors of the two transistor pairs provided in the high side and low side stage that are to control the base current of the respective bipolar transistor of the class-B output stage 13 may be connected to a rail voltage potential. The sources of the transistor pair provided in the high side stage is connected to the first rail voltage potential, while the source of the transistors of the transistor pair provided in the low side stage is connected to the second rail voltage potential.

In another more specific, exemplary embodiment, the integrated circuit 10 can also be provided with a "dedicated" circuitry for controlling the external class-B output stage. This dedicated circuitry is also referred to as a class-B drive circuit herein. The class-B drive circuit may be driven by the driver stage 11 by means of control signals. The transistors may be controlled by the drive stage 11 in an analogue fashion, in contrast to digitally switched control. The driver stage 11 may thus for example provide non-discrete currents as control signals to control the transistors.

In one exemplary implementation, the class-B drive circuit has two transistors. Furthermore, the class-AB output stage 12 of the integrated circuit 10 may also comprise two transistors. In one exemplary implementation a respective one of the two transistors of the class-B drive circuit and a respective one of the two transistors of the class-AB output stage 12 form a respective pair of transistors. The transistors of each of the two pairs may have a common gate. The common gate of the transistors of each pair may be driven by the driver stage 11 using a respective common control signal. The common control signal may cause the currents flowing through the two transistors of each pair to have a substantially fixed ratio.

The class-AB output stage 12's transistor of each pair may for example be used to control the output signal of the class-AB output stage 12 to the output terminal OUT of the integrated circuit 10. Moreover, the class-B drive circuit's transistor of each pair may be used to control the base current of a respective bipolar transistor of the class-B output stage 13 so as to control its output signal applied to the common output terminal HOUT.

The two transistor pairs may be considered to (virtually) belong to a high side stage connected to a first rail voltage potential and a low side stage connected to a second rail voltage potential. The sources of the transistors of the transistor pair of the high side stage may be connected to the first rail voltage potential via a respective resistor, a first and second resistor. The resistances of the first resistor and second resistor may have a fixed ratio. The fixed ratio may be for example chosen to obtain an equal potential at the sources of the transistors of the high side stage.

Also the sources of the transistors of the transistor pair of the low side stage may be connected to the second rail voltage potential, different from the first rail voltage potential, via a respective resistor, a third and fourth resistor. The resistances of the third resistor and fourth resistor may have a fixed ratio. The fixed ratio may be for example chosen to obtain an equal potential at the sources of the transistors of the low side stage. In an exemplary implementation, the source of each of the class-B drive circuit's transistors may be connected to the base of the respective bipolar transistor of the class-B output stage 13. This connection may be via a resistor respectively. In a further exemplary implementation, the drain of each of the class-AB output stage 12's transistors may be connected to the output terminal OUT of the integrated circuit 10 via a respective diode. The output terminal OUT is connected to the common output terminal HOUT of the hybrid output stage.

Furthermore it should be noted that the driver stage 11 as described above can be implemented as a conventional class-AB control circuit. Accordingly, the driver stage 11 is also referred to as a class-AB control circuit in the following description and in some of the figures. As indicated above, the class-AB control circuit may be implemented as an analogue circuit, in contrast to digitally switched circuit. Accordingly, the class-AB control circuit may provide non-discrete control signals to the class-AB output stage, and the class-B control circuit, where present. An exemplary implementation of a class-AB control circuit is for example described in J. H. Huijsing, "Operational Amplifiers: Theory and Design", Kluwer Academic Publishers, 2001, FIG. 5.3.21 on page 159 or in D. Monticelli, "A Quad CMOS Single-Supply Opamp with Rail-to-Rail Output Swing", mentioned earlier. Generally, it can be assumed that in a class-AB output stage 12 the transistor(s) delivering the output signal are always in a conducting state, in contrast to class-B control, where only one of the transistors is controlled to provide an output signal at a given time instance.

Depending on the type of class-AB control circuitry 11 used in the integrated circuit 10, the setting signal may for example be a first setting signal providing a reference voltage equivalent to the desired output signal. The class-AB control circuitry 11 could further receive a second setting signal providing a feedback voltage equivalent to the instantaneous output signal delivered by the hybrid output stage, and the class-AB control circuitry 11 controls the class-AB output stage, and the class-B control circuit, where present, according to the difference between the first control signal and the second control signal.

Figure 2:
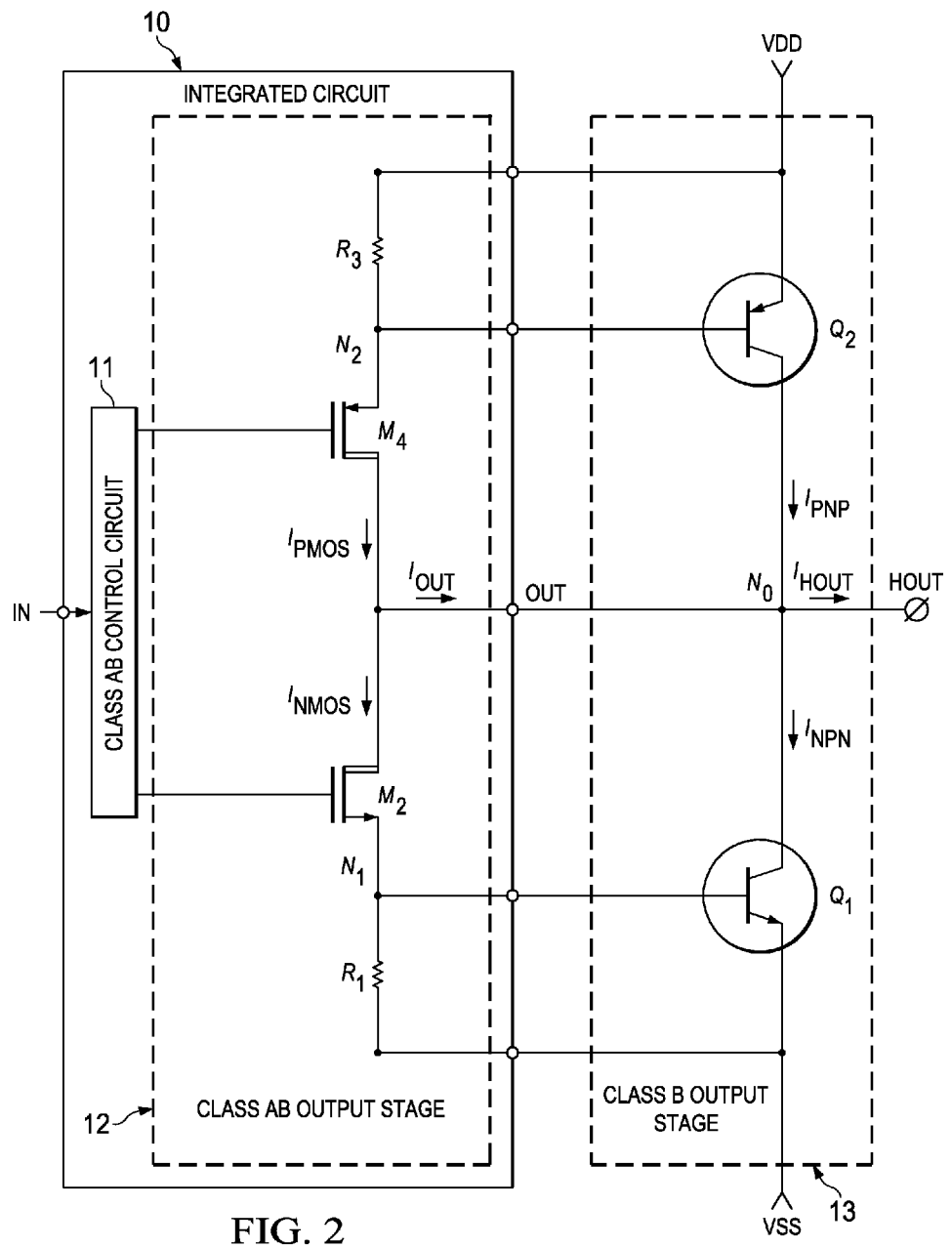
FIG. 2 shows an exemplary implementation of a driver stage and the class-AB output stage provided on the integrated circuit.

FIG. 2 shows an exemplary implementation of a driver stage 11 and the class-AB output stage 12 provided on the integrated circuit 10. The integrated circuit 10 receives one or more setting signals via one or more input terminals IN. The driver stage 11 controls the class-AB output stage 12 by applying control signals in response to the at least one setting signal. In class-AB control, the control signals ensure that a bias current keeps flowing through each of transistors $M_2$ and $M_4$ at all times, even if the transistor is not providing current to the output. To put it different, transistors $M_2$ and $M_4$ are maintained in a conduction state by the control signals of driver stage 11. Furthermore, the driver stage 11 thereby also controls the external class-B output stage 12 via the circuitry of the class-AB output stage 12. As will become more apparent, in the example of FIG. 2, the control signals decoupled from the class-AB output stage 12 are set such that only one of the two transistors $Q_1$ and $Q_2$ is in a conducting state.

The integrated circuit 10 has terminals for receiving a first rail voltage (potential) and a second rail voltage (potential). The two rail voltages are also denoted VDD and VSS in the following. The two rail voltages may be supplied from the circuit board 14 onto which the integrated circuit 10 is mounted.

Furthermore, the integrated circuit 10 has two control terminals for controlling external class-B output stage 12. In the example of FIG. 2, it is assumed that the external class-B output stage 12 is provided by a circuitry that has two transistors $Q_1$ and $Q_2$, which are controlled via respective control signals at the control terminals of the integrated circuit 10. It should be noted that the circuitry of the external class-B output stage 12 may be more complex than shown in FIG. 2, but it may be generally assumed for illustration purposes that the external class-B output stage 12 has a high side stage with one or more bipolar transistors that are to provide an output signal to the common output terminal HOUT of the hybrid output stage from the first rail voltage VDD, and which is controlled by a first control signal provided from the integrated circuit 10; and that the external class-B output stage 12 has a low side stage with one or more bipolar transistors that are to provide an output signal to the common output terminal HOUT of the hybrid output stage from the first rail voltage VSS, and which is controlled by a second control signal provided from the integrated circuit 10.

In FIG. 2, the control signals are provided in form base currents applied to the base of the NPN-transistor $Q_1$ and PNP-transistor $Q_2$ of the external class-B output stage 13, respectively. In FIG. 2, transistors $Q_1$ and $Q_2$ are exemplarily shown as bipolar transistors. The collectors of transistors $Q_1$ and $Q_2$ are connected at node $N_0$ to the common output terminal HOUT of the hybrid output stage. The emitters of transistors $Q_1$ and $Q_2$ are connected to the rail voltage potentials VDD and VSS respectively.

The class-AB output stage 12 of the integrated circuit 10 has an NMOS-transistor $M_2$, the source of which is connected via resistor $R_1$ to the rail potential VSS, and the drain of which is connected to the output terminal OUT of the integrated circuit 10. The output terminal OUT is connected through node NO to the common output terminal HOUT of the hybrid output stage. Considering the currents flowing through node $N_0$, it becomes apparent that the output current of the common output terminal HOUT of the hybrid output stage can be considered a superposition or sum of the current provided from the class-AB output stage 12 at the output terminal OUT of the integrated circuit 10 and the current of external class-B output stage 13, respectively, as will be outlined with respect to FIG. 7 in further detail below. Transistor $M_2$ and resistor $R_1$ may be considered to form a (virtual) low side stage of the class-AB output stage 12 being connected to the rail voltage VSS.

Similarly, PMOS-transistor $M_4$ and resistor $R_3$ may be considered to form a (virtual) high side stage of the class-AB output stage 12 being connected to the rail voltage VDD. The source of transistor $M_4$ is connected via resistor $R_3$ to the rail voltage VDD. The drain of transistor $M_4$ is connected to the output terminal OUT (and to thereby to the source of transistor $M_2$).

Transistor $M_2$ and transistor $M_4$ receive respective control signals from class-AB control circuitry 11 at their gate terminals. As noted before, the control signals from class-AB control circuitry 11 are applied responsive to the one or more setting signals received via the input terminal(s) IN of the integrated circuit 10 to control the output signal of the output signal at the common output terminal HOUT of the hybrid output stage. In the example of FIG. 2, the external class-B output stage 13 is controlled via the class-AB output stage 12: The nodes $N_1$ and $N_2$ of the circuitry forming the class-AB output stage 12 are connected to the respective control terminals of the integrated circuit 10 and apply a control current to the base terminal of the NPN-transistor $Q_1$ and PNP-transistor $Q_2$.

Resistors $R_1$ and $R_3$ are dimensioned such that in quiescent condition, the voltage drop over them is less than a base-emitter voltage drop required to turn on transistors $Q_1$ and $Q_2$, respectively. The quiescent condition can be defined as a condition where (substantially) no output current is flowing to/from common output terminal HOUT. This can be either due to no load being connected to the common output terminal HOUT, or due to no current flowing through the load.

The base-emitter voltage drop required to turn on a bipolar transistor is typically in a range around of 0.4V to 1V, depending on temperature and the particular transistor being used. It should be noted that class-AB output stage 12 (or the class-B control circuit 15 described later) may be designed to be insensitive to such base-emitter voltage variations, i.e. the hybrid output stage will function regardless of the exact base-emitter voltage needed to conduct a substantial current through the transistor. If a current flow through the load is desired, as set by input terminal IN, the class-AB control circuit 11 will set the gate voltages of $M_2$ and $M_4$ accordingly, which results in a current flowing to/from the output terminal OUT of the integrated circuit 10. As the same current will flow through either resistor $R_1$ or $R_3$, the base-emitter voltage of transistor $Q_1$ or $Q_2$, respectively, will increase. This will turn on the respective transistor, resulting in a small base current to flow through the base of said transistor, and a substantially larger current will be delivered to the output terminal HOUT of the hybrid output stage, due to the current gain factor of said transistor. Since the gain factor of a bipolar transistor can be in the order of several hundreds, once the threshold level is exceeded (i.e. the amount current flowing transistors $M_2$ and $M_4$ is high enough), the majority of the current at the common output terminal HOUT will be provided by one of the bipolar transistors $Q_1$ and $Q_2$. Accordingly, only one of the transistors $Q_1$ and $Q_2$ is providing an output current, at any given time, as is typical for class-B output stages.

The choice of the resistance of resistors $R_1$ and $R_3$ may take several IC-design aspects into account. Of course, the lower the resistance value, the lower the voltage drop over the resistors $R_1$ and $R_3$, which may be generally preferable to avoid bipolar transistors $Q_1/Q_2$ to turn on in quiescent condition. On the other hand, the lower the resistance, the more current must flow to turn on bipolar transistors $Q_1/Q_2$, which means that the integrated circuit 10 would have to dissipate more heat due to the higher currents flowing in the integrated circuit 10. Furthermore, the integrated circuit 10 must also be able to provide sufficient base current to the bipolar transistors $Q_1/Q_2$. For example, in some applications of the invention, this could mean that the maximum current that can be provided at the control terminals of the integrated circuit 10 should be in the range of ±8 mA to ±10 mA, which, via the current gain of transistors $Q_1/Q_2$, allows for an overall output current of hundreds of mA.

Therefore, in an exemplary implementation, the class-AB control circuitry 11 may control the transistors $M_2$ and $M_4$ such that the current flowing through same is only a few mA (e.g. ≤10 mA). In a quiescent condition, where both transistors $M_2$ and $M_4$ conduct (substantially) the same amount of current (so that (substantially) no current is flowing to/from the output terminal OUT of the integrated circuit 10), the current flowing in transistors $M_2$ and $M_4$ may be for example in the range of several hundreds of µA (e.g. 250 µA or 500 µA). The resistance of the resistors $R_1$ and $R_3$ may be for example chosen that a current in the range of 2 mA to 5 mA through transistor $M_2/M_4$, respectively, is enough to results in a sufficient voltage drop at resistor $R_1/R_3$ to ensure that bipolar transistors $Q_1$ and $Q_2$ are turned on. This voltage drop may also take into account an increased turn-on voltage drop due to temperature variations and/or variations in the production process of the bipolar transistors and/or integrated circuit. For example, the resistances of resistors $R_1$ and $R_3$ may be in the range between 300Ω and 1200Ω—the upper limit being dependent on the currents flowing in quiescent condition.

Furthermore, it should be noted that the current required in transistors $M_2$ and $M_4$ to turn on transistors $Q_1$ and $Q_2$, respectively, basically sets the limits of the dead band of the class-B output stage 13, where both transistors $Q_1$ and $Q_2$ are not in a conducting state, but the entire output current of the hybrid output stage at common output terminal HOUT is provided by the class-AB output stage 12 of the integrated circuit 10.

Generally, the level of the rail voltages is not important for the functioning of the integrated circuit 10 and the hybrid output stage. The rail voltages are often set by the maximum voltage of the IC process. Of course it should be noted that they determine the range of output signals of the class-AB output stage 12 of the integrated circuit and thus also influence the output signal of the hybrid output stage. Nonetheless, when using the rail voltages as a power supply for the class-AB output stage 12 and a class-B output stage 13 based on bipolar transistors, the absolute rail voltages may be in the range of 30V to 40V. Without loss of generality it may be assumed that one rail voltage has a positive potential, while the other rail voltage has a negative potential. The absolute value of the two rail voltages may be equal to each other. In one exemplary and implementation, the first rail voltage may be for example in the range of [30V; 40 V], for example 18 V or 36V. The second rail voltage may be for example in the range of [−30V; −40 V], for example −18V or −36V.

Figure 7A:
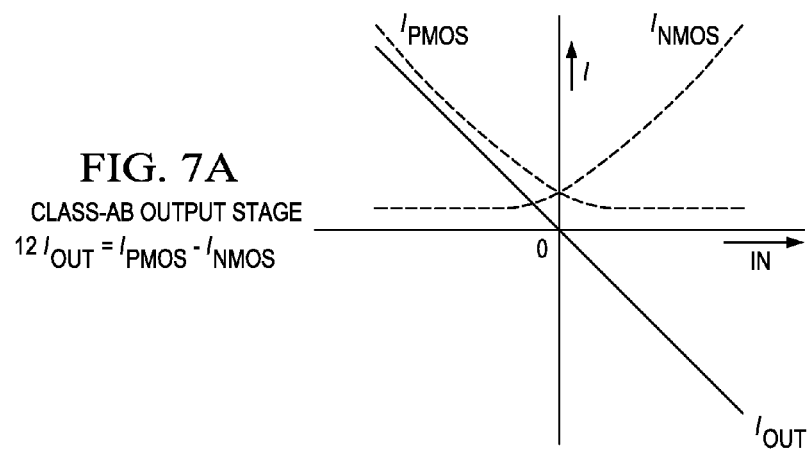
FIG. 7 exemplarily sketches the currents flowing through the MOS and bipolar transistors in the exemplary embodiment of FIG. 2 depending on the setting signal(s), and further highlights the current provided at the output terminal of the integrated circuit 10 and the current at the common output terminal of the hybrid output stage.
Figure 7B:
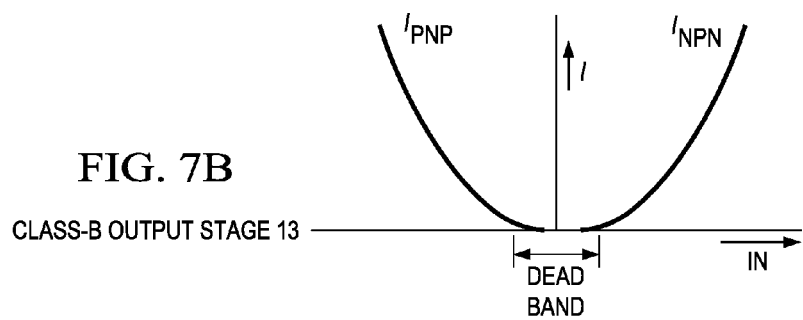
Figure 7C:
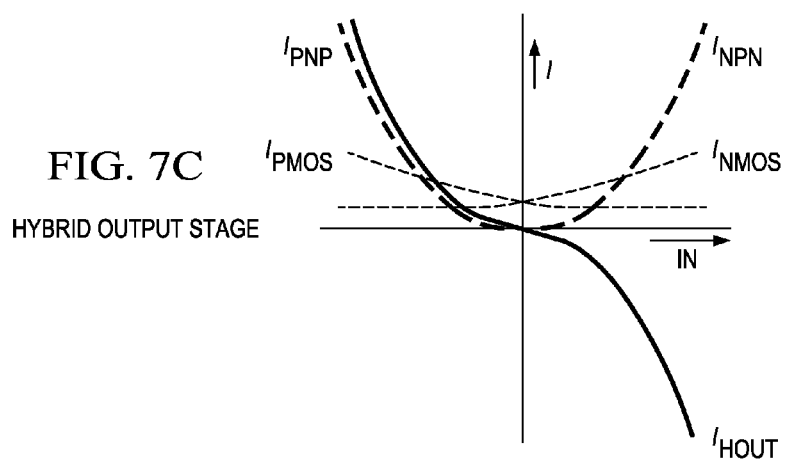

FIG. 7 exemplarily sketch the currents flowing through the MOS and bipolar transistors ($I_{PNP}$, $I_{NPN}$, $I_{PMOS}$, and $I_{NMOS}$) in the exemplary embodiment of FIG. 2 depending on the setting signal(s) IN as well as the current $I_{OUT}$ provided at the output terminal OUT of the integrated circuit 10 and the current $I_{HOUT}$ at the common output terminal HOUT of the hybrid output stage to highlight the operation of the hybrid output stage.

At a) of FIG. 7, the currents $I_{PMOS}$ and $I_{NMOS}$ of the MOS transistors transistor $M_2$ and $M_4$ of the class-AB output stage 12 are exemplarily shown. For providing positive current at output terminal OUT of the integrated circuit 10 (see the positive x-axis) the drive stage 11 controls current $I_{NMOS}$ through transistor $M_2$ to an essentially constant current level, while the current $I_{PMOS}$ through transistor $M_4$ increases with the setting signal IN. For providing a negative current at output terminal OUT of the integrated circuit 10 (see the negative x-axis) control by drive stage 11 is exactly the other way around. The output current $I_{OUT}$ at output terminal OUT is the difference between the two current, i.e. $I_{OUT}=I_{PMOS}-I_{NMOS}$. In a quiescent condition, the currents $I_{PMOS}$ and $I_{NMOS}$ of the MOS transistors transistor $M_2$ and $M_4$ are (substantially) equal to each other so that no current flows to the at output terminal OUT.

At b) of FIG. 7, the currents $I_{PNP}$ and $I_{NPN}$ of the bipolar transistors transistor $Q_1$ and $Q_2$ of the class-B output stage 13 are exemplarily shown. For providing positive current in the class-B output stage 13 (see the positive x-axis) only bipolar transistor $Q_2$ is active and provides current $I_{PNP}$ which increases with the setting signal(s) IN. For providing negative current in the class-B output stage 13 (see the negative x-axis) only bipolar transistor $Q_1$ is active and provides current $I_{NPN}$ which increases with the setting signal(s) IN. Due to the required base-emitter voltage drop of 0.4V to 1V, depending on temperature, as explained above, there is a dead band region around the center of the setting signal(s) IN, where both transistors $Q_1$ and $Q_2$ are not operating. As can be recognized at c) of FIG. 7, in this dead band region ($I_{PMOS}=I_{NMOS}=0$), only the class-AB stage 12 provides an output current, i.e. $I_{HOUT}=I_{OUT}$. Outside the dead band region, the output current of the hybrid output stage $I_{HOUT}$ is a superposition of the transistor currents, i.e. $I_{HOUT}=I_{OUT}+I_{PNP}-I_{NPNS}$. Here always one of currents $I_{PNP}$ and $I_{NPN}$ is zero, as only one of the bipolar transistors $Q_1$ and $Q_2$ is active, while $I_{OUT}$ is negative, when transistor $Q_1$ provides current, and $I_{OUT}$ is positive, when transistor $Q_1$ provides current.

Figure 3:
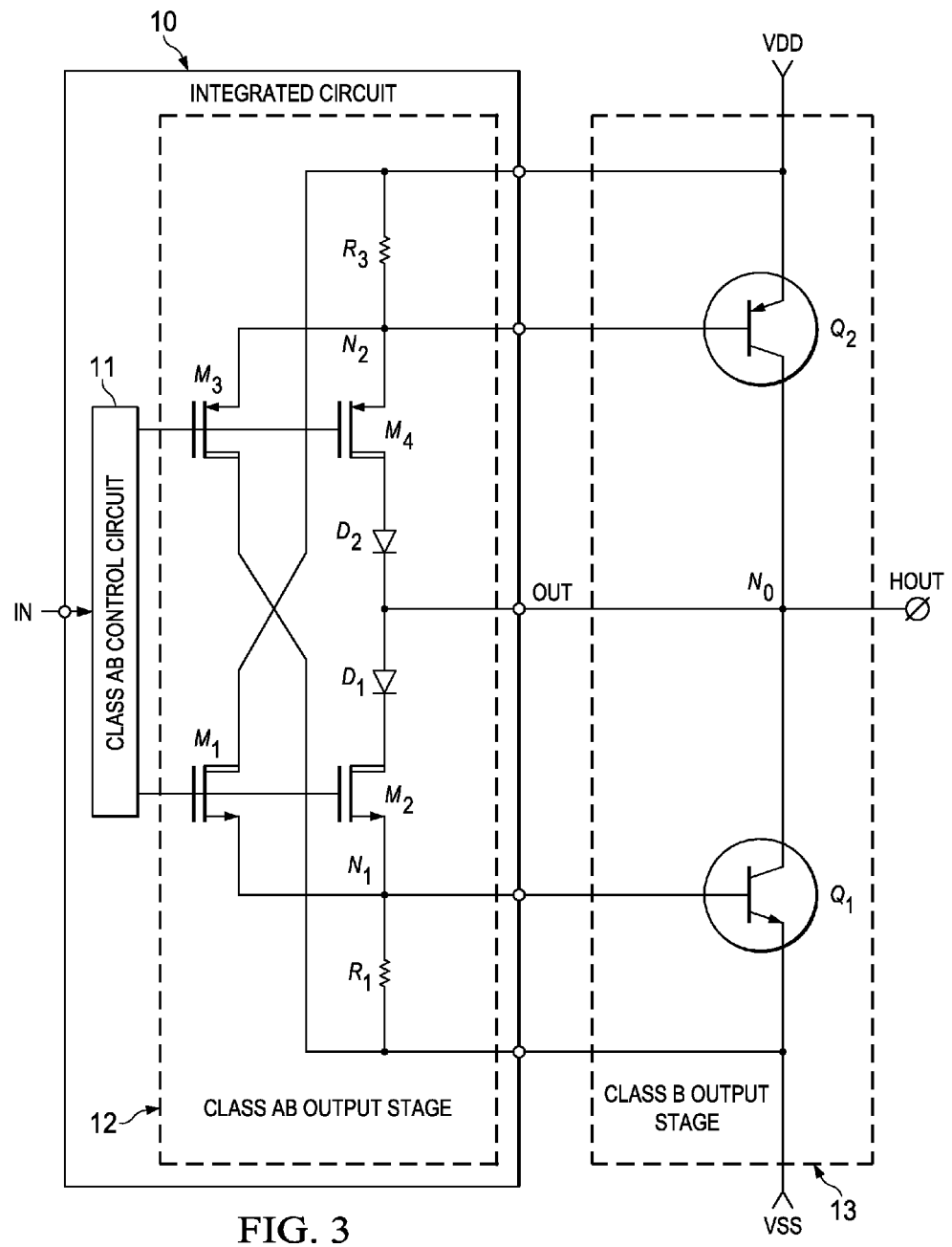
FIG. 3 shows another exemplary implementation of a driver stage and the class-AB output stage provided on the integrated circuit, which enables rail-to-rail operation of the hybrid output stage.

One potential problem with the exemplary implementation discussed with respect to FIG. 2 is that it may not allow a rail-to-rail operation of the hybrid output stage. For example when the output signal of the hybrid output stage comes close to the negative rail voltage VSS, transistor $M_2$ may not be able to deliver base current anymore, as its source is biased at the voltage drop across transistor $R_1$ away from the negative rail voltage VSS. The same is true for transistor M4 the source of which is biased at the voltage drop across transistor $R_2$ away from the positive rail voltage VDD. Accordingly, in another exemplary implementation, the class-AB output stage 12 show in FIG. 2 is further improved to allow rail-to-rail operation of the hybrid output stage. FIG. 3 shows another exemplary implementation of a driver stage 11 and the class-AB output stage 12 provided on the integrated circuit 10, which enables rail-to-rail operation of the hybrid output stage.

In comparison to FIG. 2, the class-AB output stage 12 in FIG. 3 includes additional NMOS-transistor $M_1$, PMOS-transistor $M_3$, and diodes $D_1$ and $D_2$. The addition of transistors $M_1$ and $M_3$, and diodes $D_1$ and $D_2$ allow the class-AB output stage 12 to operate close to the supply rails. The anode of diode $D_1$ is connected to the output terminal OUT of the integrated circuit 10 and the cathode thereof is connected the drain of transistor $M_2$. The cathode of diode $D_2$ is connected to the output terminal OUT of the integrated circuit 10 and the anode thereof is connected the drain of transistor $M_4$. The source of transistor $M_1$ is connected to the node $N_1$ and the drain of transistor $M_1$ is connected to the first rail voltage VDD. The source of transistor $M_3$ is connected to the node $N_2$ and the drain of transistor $M_3$ is connected to the second rail voltage VSS.

Transistors $M_1$ and diode $D_1$ may be considered part of the low side stage of class-AB output stage 12 connecting to rail voltage VSS. Transistors $M_2$ and diode $D_2$ may be considered part of the high side stage of class-AB output stage 12 connecting to rail voltage VDD. Transistors $M_1$ and $M_2$ may be considered a transistor pair of the low side stage of class-AB output stage 12. Transistors $M_3$ and $M_4$ may be considered a transistor pair of the high side stage of class-AB output stage 12.

Considering again the for example when the output signal of the hybrid output stage comes close to the negative rail voltage VSS, transistor $M_2$ may not be able to deliver base current anymore, as noted above. In this situation, transistor $M_1$ can provide current directly from the opposite rail voltage VDD thereby allowing sufficient current to flow to the base of bipolar transistor $Q_1$ to keep the transistor conducting. Diode $D_1$ is added to prevent a reverse current flowing from the source to the drain of transistor $M_2$, when the output signal at common output terminal HOUT is close to the negative rail voltage VSS. Similarly, transistor $M_3$ and diode $D_2$ are added for the case where the output signal at common output terminal HOUT comes close to the positive rail voltage VDD.

As shown in FIG. 3, the pair of transistors $M_1$ and $M_2$ has a common gate, which allows for their common control by means of a control signal from class-AB control circuitry 11. The common gate ensures that the currents flowing in the two transistors are matched, i.e. have a fixed ratio to each other. Similarly, also the pair of transistors $M_3$ and $M_4$ has a common gate, which allows for their common control by means of a control signal from class-AB control circuitry 11. The common gate ensures that the currents flowing in the two transistors of each pair to be matched, i.e. to have a fixed ratio ($r_{i(M1)}/r_{i(M2)}$ and $r_{i(M3)}/r_{i(M4)}$, respectively). The ratio may be an integer ratio. In one exemplary implementation, the current through transistors $M_1$ and $M_3$ is higher than through transistors $M_2$ and $M_4$, respectively, i.e. ($r_{i(M1)}/r_{i(M2)}$)>1 and $r_{i(M3)}/r_{i(M4)}$)>1, or vice versa. It should be noted that the sum of the current flowing through the pair of transistors $M_1$ and $M_2$ and pair of transistors $M_3$ and $M_4$ in quiescent condition may be taken into account to dimension the resistance of resistors $R_1$ and $R_3$, such that bipolar transistors $Q_1$ and $Q_2$ surely turned off in this state.

Figure 4:
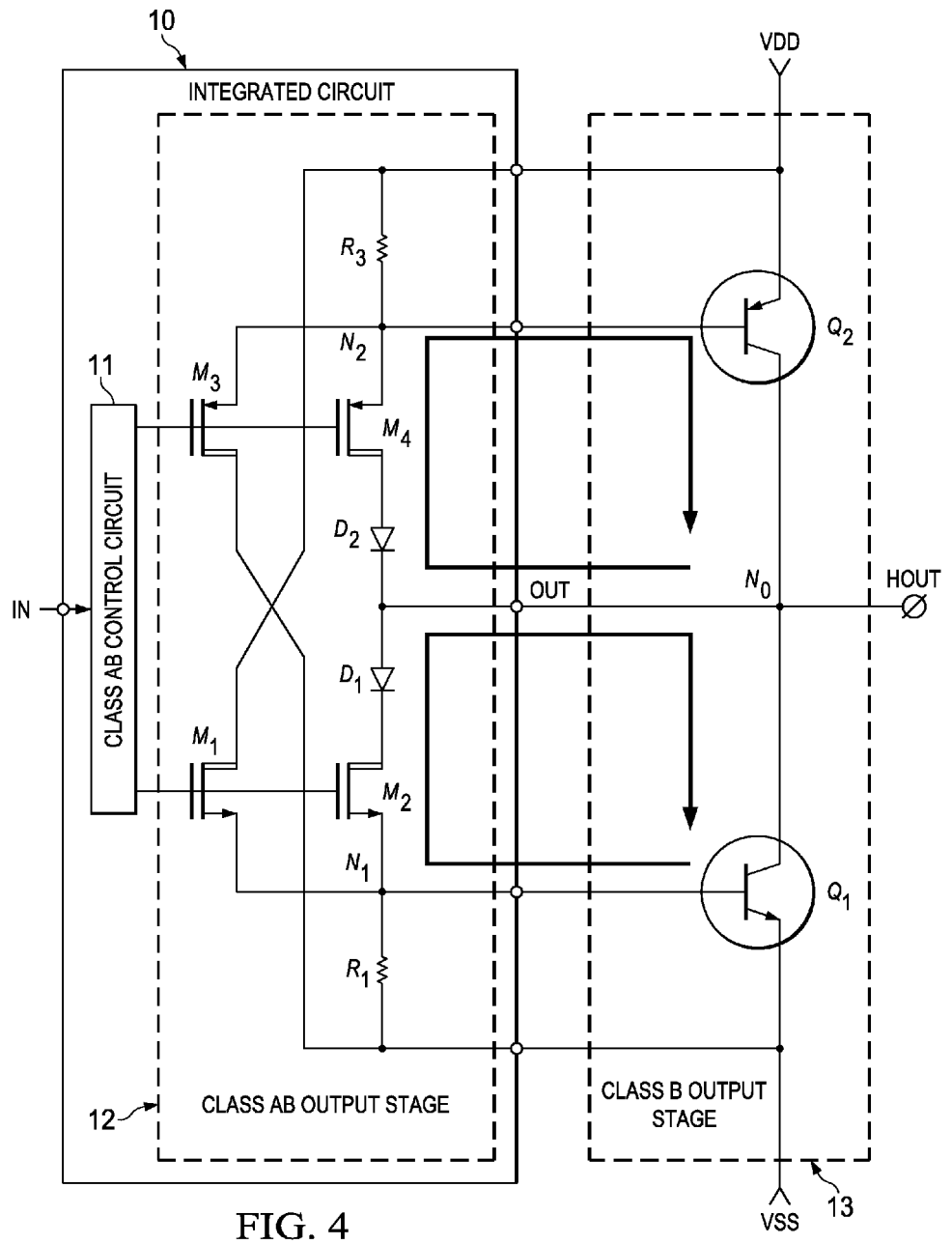
FIG. 4 shows potential loops in the circuitry of FIG. 3.

Simulation results of the configuration of the class-AB output stage 12 and its interoperation with the external class-B output stage 13 show that internal feedback loops may occur, as exemplarily shown in FIG. 4. In the low side stage, an internal loop is formed from the gates of transistors $M_1$ and $M_2$ (source follower), via bipolar transistor $Q_1$ (being an inverting gain stage) to the output of the hybrid output stage, and back to the gates of transistors $M_1$ and $M_2$ via parasitic capacitors and/or the miller capacitors (not shown in FIG. 4). A similar loop exists on the high side stage of the circuit around transistors $M_3$ and $M_4$ and bipolar transistor $Q_2$. These loops may cause the hybrid output stage to ring or to become unstable.

Figure 5:
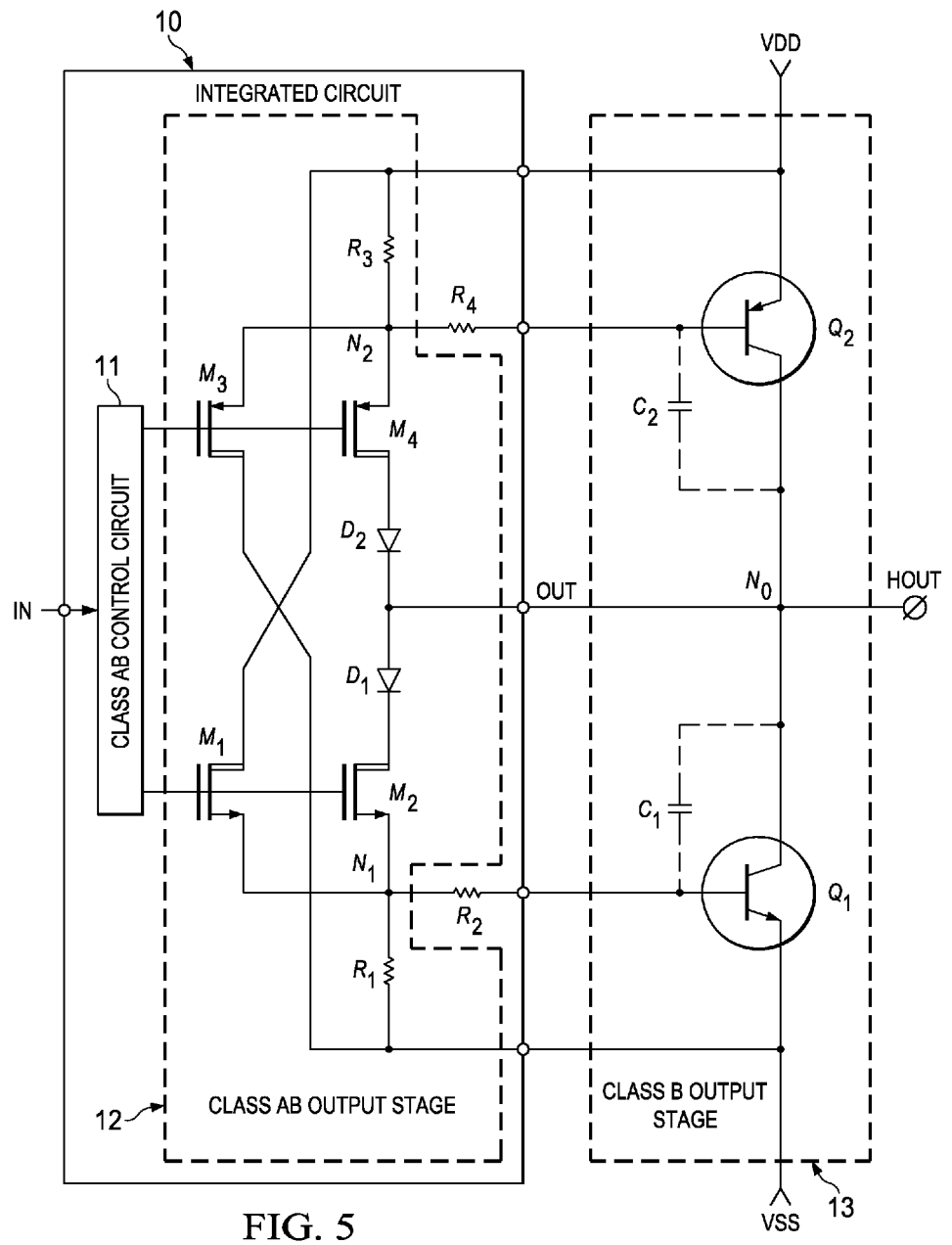
FIG. 5 shows a further exemplary implementation of a driver stage and the class-AB output stage provided on the integrated circuit, which allows avoiding loops as shown in FIG. 4.

FIG. 5 shows a further exemplary implementation of a driver stage and the class-AB output stage provided on the integrated circuit, which allows avoiding these internal loops. To avoid the lower loop in FIG. 4, a resistor $R_2$ is added in between the base of bipolar transistor $Q_1$ and node $N_1$, which lowers the effective transit frequency and thus gain-bandwidth of transistor $Q_1$. Furthermore, capacitor $C_1$ is added between the base and emitter of transistor $Q_1$ as a further measure to stabilize the loop by means of the miller effect. Similarly, capacitor $C_2$ and resistor $R_4$ are added to improve stability with respect to the upper loop shown in FIG. 5. It should be noted that whether the internal loops shown in FIG. 4 actually become unstable may depends on the properties of bipolar transistors $Q_1$ and $Q_2$. Accordingly, the modifications shown in FIG. 5 may not be necessary.

Figure 6:
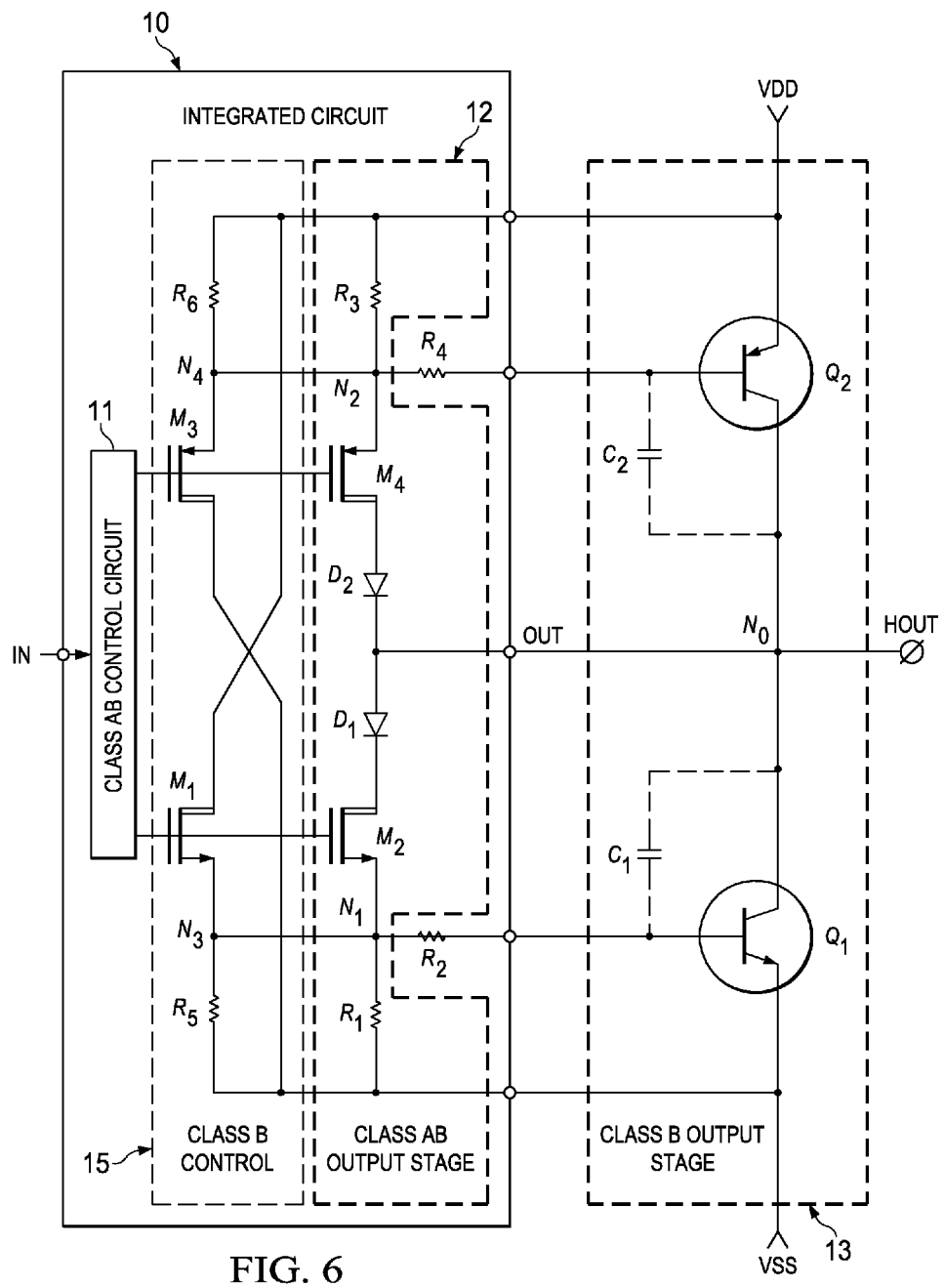
FIG. 6 shows a further exemplary implementation of a driver stage and the class-AB output stage provided on the integrated circuit, where the external output stage is driven through dedicated class-B control circuitry on the integrated circuit.

In the examples of FIGS. 2 to 5, the driver stage 11 drives the external output stage 13 via the class-AB output stage 12, as the control signals of the integrated circuit 10 provided to the external output stage 13 are decoupled from the circuitry forming class-AB output stage 12. However, in other embodiments, the control signals of the integrated circuit 10 provided to the external output stage 13 may also not be decoupled from the circuitry forming class-AB output stage 12, but may be provided by some separate circuitry in the integrated circuit 10. FIG. 6 shows a further exemplary implementation of a driver stage 11 and the class-AB output stage 12 provided on the integrated circuit 13, where the external output stage 13 is driven through dedicated class-B control circuitry 15 on the integrated circuit 10. FIG. 6 is based on the circuit shown in FIG. 5, but could also be based on the circuit as shown in FIG. 3.

Instead of connecting the sources of transistors $M_1$ and $M_3$ to the rail voltages VSS and VDD, respectively, though nodes $N_1$ and $N_2$ as shown in FIGS. 3 and 5, the sources of transistors $M_1$ and $M_3$ to the rail voltages VSS and VDD via separate resistors $R_5$ and $R_6$. More specifically, the source of transistor $M_1$ is connected to the second rail voltage VSS via resistor $R_5$, and its drain is connected to the first rail voltage VDD. The node $N_3$ in between resistor $R_5$ and the source of transistor $M_1$ is connected to the base of bipolar transistors $Q_1$ (optionally via resistor $R_2$). Further, the source of transistor $M_3$ is connected to the first rail voltage VDD via resistor $R_6$, and its drain is connected to the second rail voltage VSS. The node $N_4$ in between resistor $R_6$ and the source of transistor $M_2$ is connected to the base of bipolar transistors $Q_2$ (optionally via resistor $R_4$).

As in FIGS. 3 and 5, the pair of transistors $M_1$ and $M_2$ has a common gate, which allows for their common control by means of a control signal from class-AB control circuitry 11. The common gate ensures that the currents flowing in the two transistors are matched, i.e. have a fixed ratio to each other. Similarly, also the pair of transistors $M_3$ and $M_4$ has a common gate, which allows for their common control by means of a control signal from class-AB control circuitry 11. The common gate ensures that the currents flowing in the two transistors of each pair to be matched, i.e. to have a fixed ratio. The ratio may be an integer ratio.

Moreover, also the resistances of resistors $R_1$ and $R_5$ and resistors $R_2$ and $R_6$ are matched, i.e. have a fixed ratio, respectively. In one implementation the ratio $r_{R1/R5}$ of the resistances of resistors $R_1$ and $R_5$ is inversely proportional to the current ratio $r_{i(m1)}/i_{(m2)}$ of the currents flowing in the two transistors $M_1$ and $M_2$. Similarly, the ratio $r_{R3/R6}$ of the resistances of resistors $R_3$ and $R_6$ is inversely proportional to the current ratio $r_{i(m3)}/i_{(m4)}$ of the currents flowing in the two transistors $M_3$ and $M_4$. This ensures that the potentials at the source of the transistors $M_1$ and $M_2$ and the transistors $M_3$ and $M_4$ is approximately identical.

In the forgoing embodiments, reference has been made to an output signal (HOUT) of the hybrid output stage or an output signal (OUT) of the integrated circuit 10. It should be noted that the output signal may be an output current or an output voltage. Furthermore, it should be noted that the integrated circuit 10 disclosed herein may be mounted on any suitable type of circuit board 14, e.g. a printed circuit board (PBC), which provided the external output stage 13. The circuit board 14 with the integrated circuit 10 mounted thereon may be included in any type of electronic device. For example, the circuit board 14 with the integrated circuit 10 may be part of a measurement device, such as for example a measurement device for magnetic fields, where the output signal of the hybrid output stage may be used as a current source for driving a magnetic field sensor equipment.

The above disclosure is meant to be illustrative of the principles and various embodiments of the invention. Numerous variations and modifications will become apparent to those skilled in the art. It is intended that the disclosure, including the claims and figures, be interpreted to embrace all such variations and modifications.

The invention claimed is:

1. A circuit comprising:
 a class-AB output stage configured to output a class-AB output signal to a class-AB output terminal, and
 a class-B output stage configured to output a class-B output signal
 wherein the class-AB output stage and the class-B output stage are configured to form a hybrid output stage that provides a hybrid output signal that is a superposition of the class-AB output signal and the class-B output signal on a common output terminal,
 the class-AB output stage including two pairs of transistors, each including a class-AB output transistor and a class-B control transistor, and each with a common control terminal, wherein
  the class-AB output transistors are connected in a push-pull configuration at the class-AB output terminal, and configured to control the class-AB output signal, and
  the class-B control transistors are configured to control the class-B output signal of the class-B output stage, and
 a driver stage for controlling the class-AB output stage and the class-B output stage in response to at least one setting signal, which indicates the desired hybrid output signal to be output at the common output terminal of the hybrid output stage,
 wherein, for each pair of transistors in the class-AB output stage, the driver stage is configured to provide a common control signal to the common control terminal so that the currents flowing through the two transistors have a substantially fixed ratio.

2. The circuit according to claim 1, wherein the driver stage is adapted to control the class-B output stage directly or via the class-AB output stage by at least one control signal output to the external class-B output stage.

3. The circuit according to one of claim 1, wherein the driver stage is adapted to drive the hybrid output signal of the hybrid output stage rail-to-rail.

4. The circuit according to one of claim 1, wherein the class-B output stage comprises one or more bipolar transistors, each of which is driven by a control signal output by respective class-B control transistors.

5. The circuit according to claim 1, wherein the class-AB output transistors and the class-B control transistors are MOS transistors, and the sources of the transistors of each pair are connected to each other via a respective node so as to have an equal potential.

6. The circuit according to claim 5, wherein each node is connected to a respective first rail voltage potential via a respective first resistor.

7. The circuit according to claim 5, wherein the class-B output stage includes bipolar transistors connected in a push-pull configureation, and respective nodes are connected to respective bases of the bipolar transistors through respective resistors.

8. The circuit according to one of claim 5, wherein the drains of the class-AB output transistors are connected to the class-AB output terminal through a diode.

9. The circuit according to claim 6, wherein the sources of the class-B control transistors are connected to the respective first rail voltage potential through respective second resistors.

10. The circuit according to claim 9, wherein the resistances of the first and second resistors of each transistor pair have a fixed ratio chosen to obtain a common potential at the sources of the transistors of each pair.

11. The circuit according to claim 1, wherein there are two pairs of transistors allowing for a rail-to-rail operation of the hybrid output stage.

12. The circuit according to claim 1, wherein at least one setting signal comprises a first setting signal providing a reference voltage equivalent to the desired output signal, and a second setting signal providing a feedback voltage equivalent to the instantaneous output signal delivered by the hybrid output stage.

* * * * *